(12) United States Patent
Morgan et al.

(10) Patent No.: US 7,361,988 B2
(45) Date of Patent: Apr. 22, 2008

(54) APPARATUSES AND METHODS TO ROUTE LINE TO LINE

(75) Inventors: Thomas O. Morgan, Hillsboro, OR (US); James D. Jackson, Beaverton, OR (US); Weston C. Roth, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 10/740,149

(22) Filed: Dec. 17, 2003

(65) Prior Publication Data

US 2005/0138592 A1 Jun. 23, 2005

(51) Int. Cl.
*H01L 23/48* (2006.01)
*H01L 21/44* (2006.01)

(52) U.S. Cl. .............................. 257/734; 257/E23.011; 257/E21.506; 438/612; 716/15

(58) Field of Classification Search ................ 257/734, 257/E23.01, E23.011, E21.506; 438/612; 716/12, 15
See application file for complete search history.

(56) References Cited

U.S. PATENT DOCUMENTS

| | | | |
|---|---|---|---|
| 5,221,209 A * | 6/1993 | D'Amico ..................... 439/71 |
| 5,531,021 A | 7/1996 | Kolman et al. |
| 6,011,695 A * | 1/2000 | Dumke ........................ 361/777 |
| 6,268,568 B1 * | 7/2001 | Kim ............................ 174/250 |
| 6,534,872 B1 * | 3/2003 | Freda et al. ................. 257/774 |
| 6,573,595 B1 * | 6/2003 | Chen et al. .................. 257/698 |
| 6,578,755 B1 * | 6/2003 | Elenius et al. .............. 228/254 |
| 6,580,608 B1 | 6/2003 | Searls et al. |
| 6,622,905 B2 * | 9/2003 | Shier et al. ............ 228/180.22 |
| 6,713,871 B2 | 3/2004 | Searls et al. |
| 6,720,501 B1 * | 4/2004 | Henson ....................... 174/262 |
| 6,730,860 B2 | 5/2004 | Searls et al. |
| 6,756,671 B2 * | 6/2004 | Lee et al. .................... 257/737 |
| 6,891,260 B1 * | 5/2005 | Mora et al. ................. 257/691 |
| 2004/0021232 A1 * | 2/2004 | Pekin et al. ................ 257/778 |
| 2005/0071799 A1 * | 3/2005 | Ramakrishnan ............. 716/15 |

* cited by examiner

*Primary Examiner*—T. N. Quach
(74) *Attorney, Agent, or Firm*—Blakely, Sokoloff, Taylor & Zafman LLP

(57) ABSTRACT

Various methods and apparatuses are described in which a printed circuit board has trace lines. Input/output pads on the printed circuit board may have approximately the same width dimension as a trace line connected to those input/output pads. A first group of vias in the printed circuit board may be aligned into a planar line with a set corridor spacing between adjacent of groups of vias also aligned into a planar line with the same axis to allow a routing space for lines in multiple layers of the printed circuit board to occur in the routing space established by the set corridor spacing.

17 Claims, 10 Drawing Sheets

Cont.
↓

| Applying a solder paste mixture with a squeegee to fill in the solder paste mixture into all of the apertures of the stencil |
| 518 |

↓

| Controlling the amount of volume of solder to form the solder connection between the printed circuit board and the package by using the stenciling process. |
| 520 |

↓

| Inserting the various electrical components onto the printed circuit board |
| 522 |

↓

| Aligning the package to the printed circuit board by superimposing an image of the package over an image in a mirror of the printed circuit board |
| 524 |

↓

| Reflowing the package to printed circuit board combination to liquefy the solder to create the solder connections between the printed circuit board and package. |
| 526 |

↓

( End )

FIG. 5B

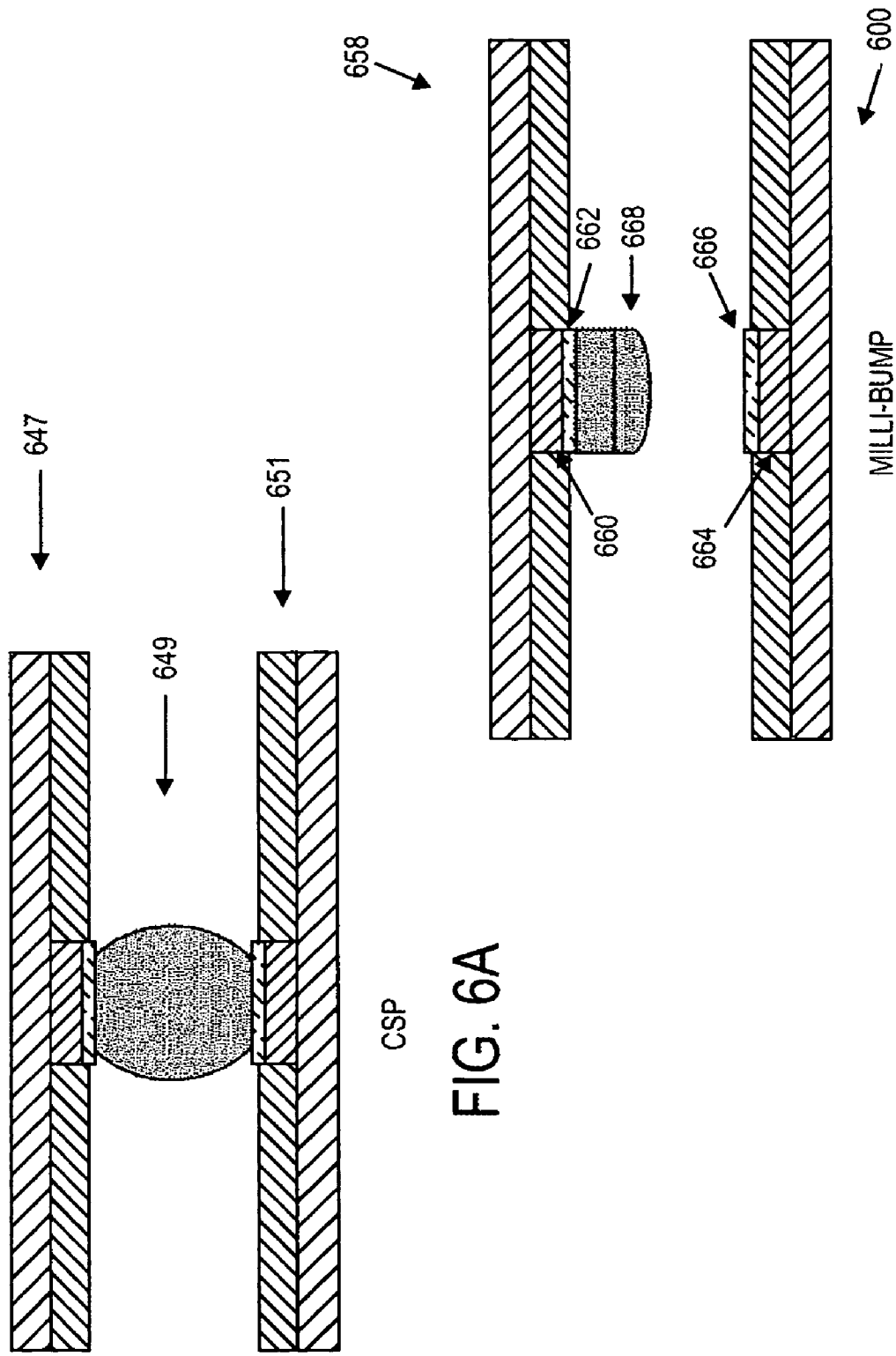

US 7,361,988 B2

APPARATUSES AND METHODS TO ROUTE LINE TO LINE

FIELD

An aspect of an embodiment of the invention relates to the field of printed circuit boards; and more specifically, to the routing of lines and connections on a printed circuit board.

BACKGROUND

FIG. 1 illustrates a layout diagram of a typical pad and trace line routing scheme for a printed circuit board. The spherical input-output pads, such as a first input-output pad, may each have a trace line connecting to that input-output pad. Some spherical input-output pads do not have a trace connected to that pad, such as a second input-output pad. The trace lines cannot be routed to the second input-output pad because a routing path does not exist due to minimum space requirements between the trace line and 1) neighboring trace lines as well as 2) input-output pads. Not enough routing space exists to route a trace line to that pad.

The spherical input/output pads are generally larger in width than the trace lines. This relationship may cause some trace lines, such as the first trace line, to be routed in off angles to maintain the minimum spacing requirements when routing around a given input/output pad to connect to its intended input/output pad. The routing of the trace lines in an off-angled shape effects the amount of trace lines that may be routed on a layer of a printed circuit board because of the minimum spacing requirements needed to be maintained between this trace line routed at an off angle and neighboring electrically conductive components. This spherical solder ball and input/output pad technology may reduce the routability of traces lines and the quantity of input/output pad actually connected to a trace line.

Typically, increasing the size of the package containing a printed circuit board and the amount of layers in a printed circuit board increases the number of input-output pads that can have a trace line routed to that pad. However, increasing the number of layers in a printed circuit board and the physical dimensions of that printed circuit board may increase the cost of the printed circuit board.

Also, as the physical size of some packages increases that package may exhibit co planarity issues, which can result in open joints. Either the package or the printed circuit board is not flat and level throughout its respective planar surface. Due to a height difference in the non co-planar surfaces, one or more of the solder balls does not physically connect to the surface of both the package and the printed circuit board.

A typical manufacturing process for securing a package to a printed circuit board is to use pre-formed solder spheres which are attached to the package substrate via a paste and ball attach. The package is then placed on the printed circuit board, which has pasted pads, and the entire assembly is reflowed providing a solder joint between the package and board.

The spherical solder ball typically placed on the input/output pad may provide an electro-mechanical connection to the package containing that printed circuit board. The solder ball of the input/output pad mates up with a solder connection on the package to make an electrical connection between the package and the printed circuit board. Also, the solder ball of the input/output pad mates up with that solder connection on the package to make a mechanical bond to secure the printed circuit board to the package in order to maintain the alignment of those two components. Decreasing pad size for some Ball Grid Array routing schemes may lead to solder fatigue and other solder joint reliability problems. The solder joint reliability problems may be exacerbated by coefficient of thermal expansion mismatches between the material forming the package and the materials forming the printed circuit board. Also, decreasing pitch spacing between trace lines may be an increased opportunity for solder shorts due to excess solder from the solder ball on the package and the solder paste on the printed circuit board.

BRIEF DESCRIPTION OF THE DRAWINGS

The drawings refer to embodiments of the invention in which:

FIG. 2b illustrates a magnified view of the upper right corner of the example printed circuit board illustrated in FIG. 2a.

FIG. 2c illustrates a magnified view of the center of the example printed circuit board illustrated in FIG. 2a.

FIGS. 5a and 5b illustrate a flow diagram of an embodiment to generate a solder connection between a pad of a package and an input/output pad on a printed circuit board having approximately the same width dimension as a trace line connected to that input/output pad.

FIG. 6a illustrates a cross-sectional view of a Chip Scale Package using a solder ball to establish a solder bond between the printed circuit board and package.

FIG. 6b illustrates a cross-sectional view of a package using a solder bump to establish a solder bond between the printed circuit board and package.

Figure 1:
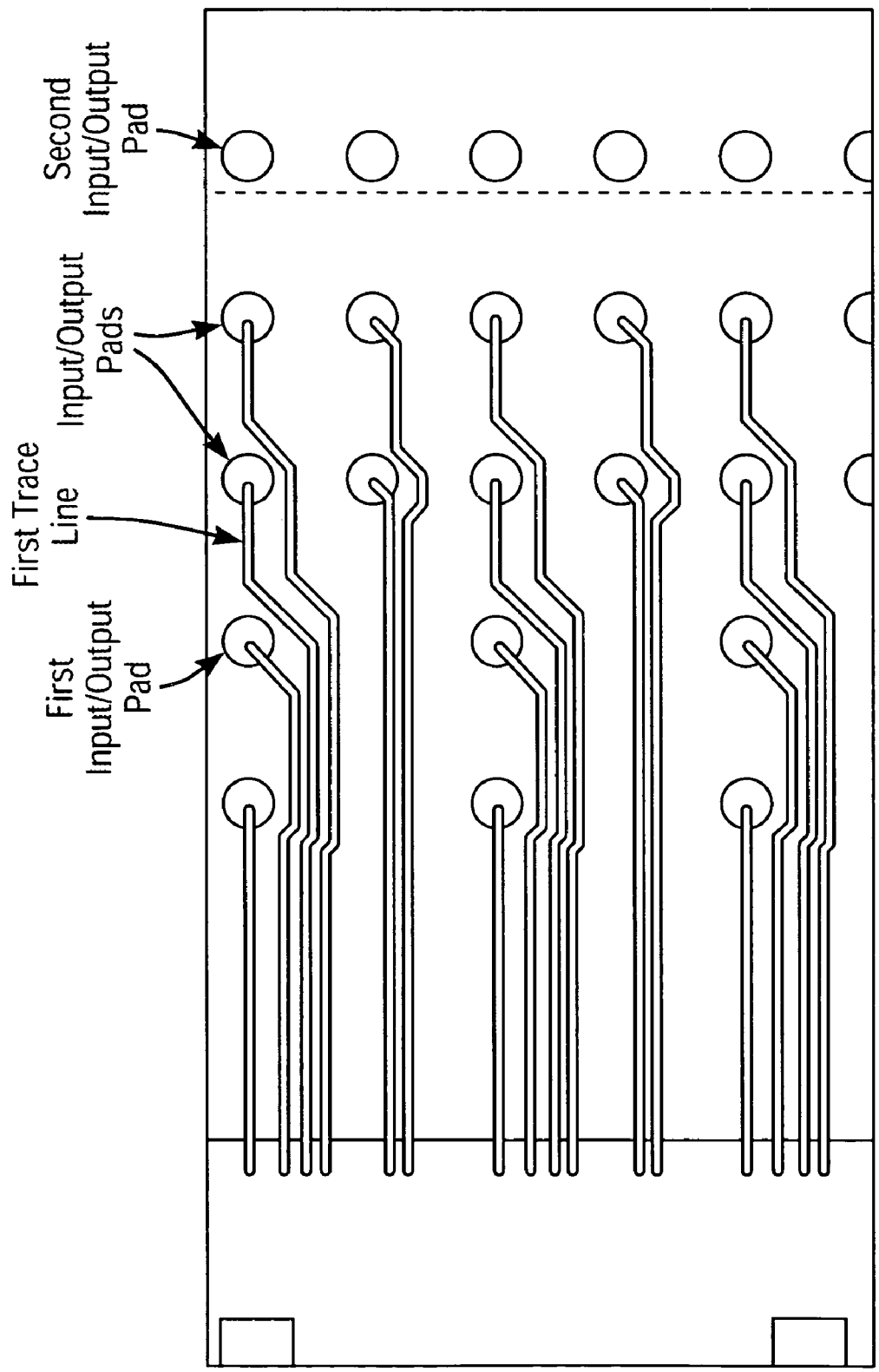
FIG. 1 illustrates a layout diagram of a typical pad and trace line routing scheme for a printed circuit board.

While the invention is subject to various modifications and alternative forms, specific embodiments thereof have been shown by way of example in the drawings and will herein be described in detail. The embodiments of the invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memory columns in a group of memory columns, etc., in order to provide a thorough understanding of the embodiments of the invention. It will be apparent, however, to one of ordinary skill in the art that the embodiments of the invention may be practiced without these specific details. However, the specific numeric reference should not be interpreted as a literal sequential order but rather interpreted that the first via is different than a second via. Thus, the specific details set forth are merely exemplary. The specific details may be varied from and still be contemplated to be within the spirit and scope of the present invention.

In general, various methods and apparatuses are described in which a printed circuit board has trace lines. Input/output pads on the printed circuit board may have approximately the same width dimension as a trace line connected to those input/output pads. A first group of vias in the printed circuit board may be aligned into a planar line with a set corridor spacing between adjacent of groups of vias also aligned into a planar line with the same axis to allow a routing space for lines in multiple layers of the printed circuit board to occur in the routing space established by the set corridor spacing. Solder connections between the input/output pads and a package may be created by a solder screening process that utilizes a solder stencil on the package as well as the printed circuit board. The stencil and a subsequent reflow operation may create solder bumps that extend from the package to a desired height prior to delivery of the package to an assembly line.

Figure 2A:
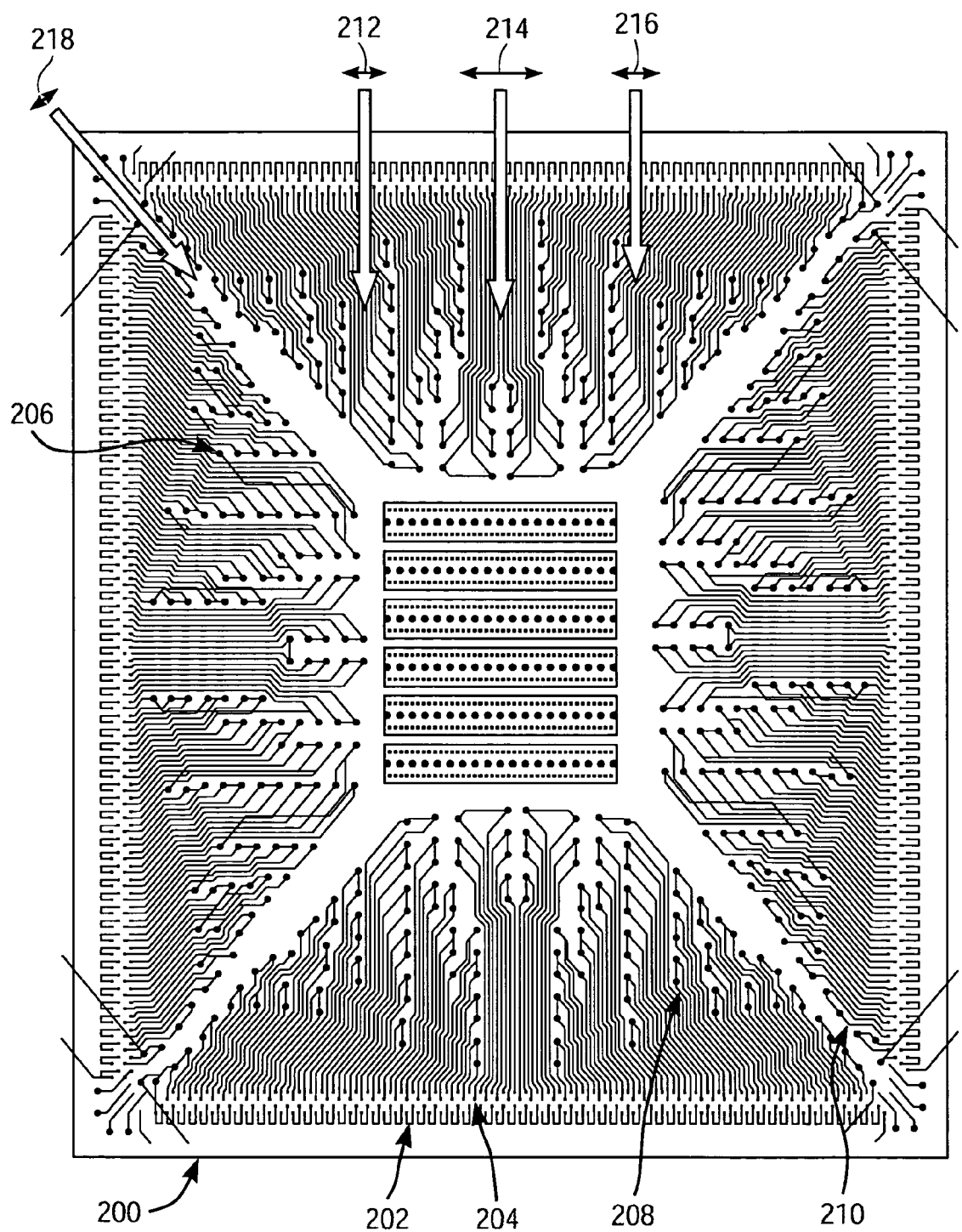
FIG. 2a illustrates a layout diagram of a top layer of an example printed circuit board generated using an embodiment a routing scheme that aligns linear groups of vias in a printed circuit board in columns, rows, and diagonals with a set corridor spacing between adjacent linear groups of vias.

FIG. 2a illustrates a layout diagram of a top layer of an example printed circuit board 200 generated using an embodiment a routing scheme that aligns linear groups of vias in a printed circuit board 200 in columns, rows, and diagonals with a set corridor spacing between adjacent linear groups of vias. Referring to FIG. 2, the printed circuit board 200 may have multiple layers, such as four. The top layer of the printed circuit board 200 may have offset rows of square input/output pads 202, 204 around the rectangular edge of the printed circuit board 200 and a high density of power connections in the center of the printed circuit board 200. The top layer has trace lines routing signals to each input/output pad.

The top layer has rows of circular vias, such as a first row of vias 206, columns of circular vias, such as a first column of vias 208, and diagonal lines of circular vias, such as a first diagonal line of vias 210. The vias may form groups of three of more vias having a fixed relationship with neighboring linear groups of three of more vias. The group of vias may be aligned into a planar line with a set corridor spacing between adjacent of groups of vias aligned into a planar line with the same axis. The planar line of vias may be, for example, a row of vias, a column of vias, or a diagonal line of vias. Each, for example, row of three of more vias, has a fixed parallel relationship with neighboring groups of vias aligned in row. Between the parallel groups of vias exists set corridor spacing to create an obstruction free routing space for power lines and signal lines in the various multiple layers of the printed circuit board 200 to occur in the routing space established by the set corridor spacing. For example, the parallel groups of vias establish a first set corridor spacing area 212, a second set corridor spacing area 214, a third set corridor spacing area 216, a fourth set corridor spacing area 218, and so on.

A via may be hole filed with a conductive material, such as metal, to establish a connection between a first layer of a printed circuit board 200 and one or more other layers of that printed circuit board 200. The circular shape of a via may effect routing of power lines and signal lines in the top layer as well as the multiple layers below the top layer because the via may project through and exist on these multiple layers. The via generally creates an electrically conductive obstruction that trace lines may have to route at off angles to route around that obstruction. A design guideline for routing of trace lines tries to maintain a minimum space between the electrically conductive trace lines and 1) vias as well as 2) neighboring trace lines. The set corridor of spacing created by the alignment of the linear groups of vias with respect to a neighboring group of vias creates unobstructed routing of lines in the routing space established by the set corridor spacing in the top layer as well as layers underneath the top layer. The presence of a via and trying to route around a via while still maintaining minimum spacing requirement between the trace line that via and neighboring trace lines can be the second largest factor in filling up available routing space on a printed circuit board.

Likewise, the presence of numerous circular input/output pad many times the width of a trace line that disrupt minimum spacing requirements can be the largest factor in filling up available routing space on a printed circuit board. However, the input/output pads may be created at the same width dimension as a trace line connected to that input/output pad. The input/output pads connecting at the edge of the printed circuit board may have the same width dimension as a trace line connected to that input/output pad. The printed circuit board 200 may have two or more offset rows of square input/output pads 202, 204 connecting at the edge of the printed circuit board 200.

Figure 2B:
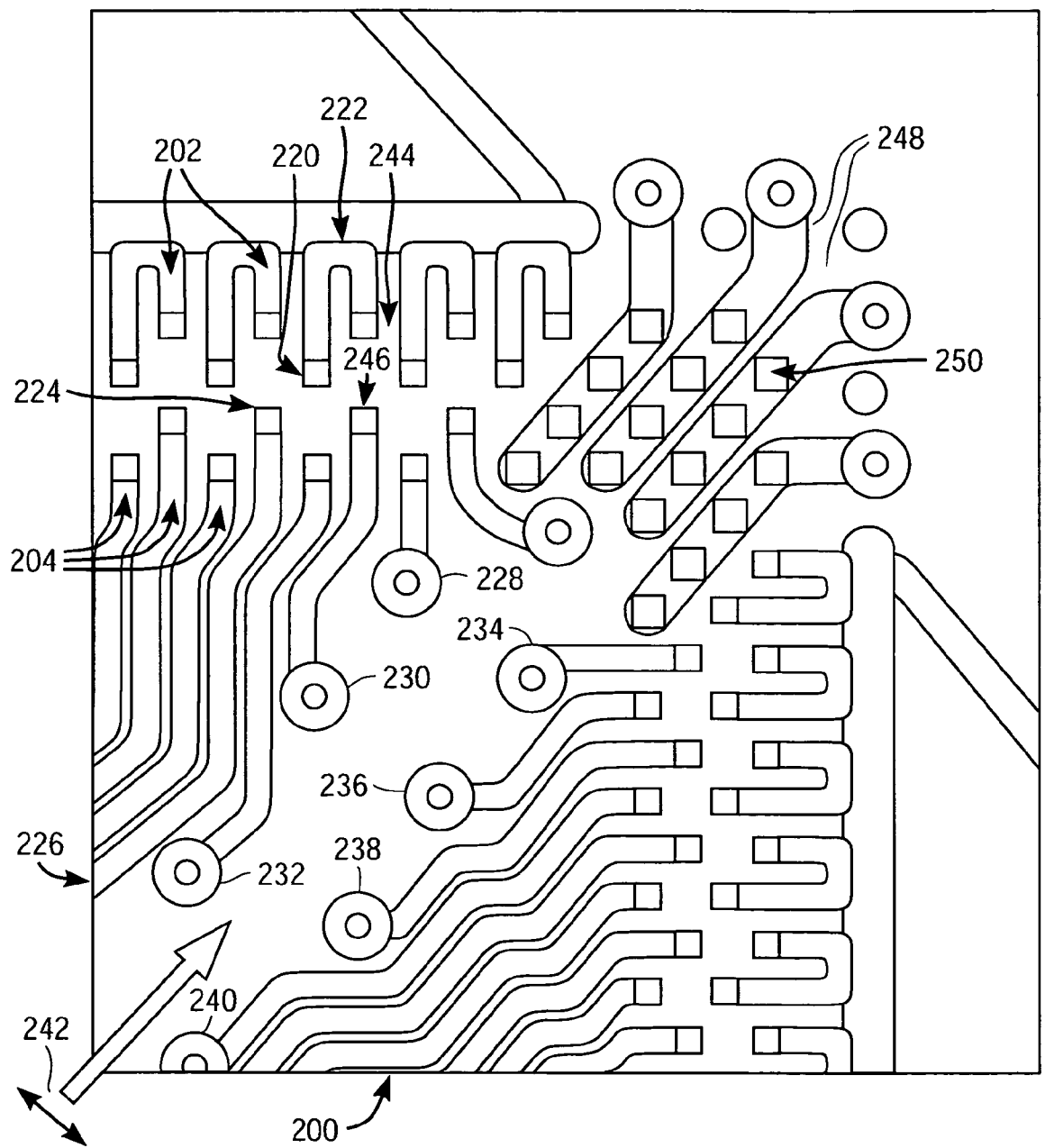

FIG. 2b illustrates a magnified view of the upper right corner of the example printed circuit board illustrated in FIG. 2a. Referring to FIG. 2b, a first rectangular input/output pad 220 may have approximately the same width dimension as a first trace line 222 connected to that input/output pad. Similarly, a second rectangular input/output pad 224 may have approximately the same width dimension as a second trace line 226 connected to that input/output pad.

The vias may be aligned in a symmetric linear groups having either a diagonal, horizontal, or a vertical relationship to a neighboring group of vias. For example, a first linear group of vias may consist of a first via 228, a second via 230, and a third via 232. A second linear group of vias may consist of a fourth via 234, a fifth via 236, a sixth via 238, and a seventh via 240. The first linear group of vias may be aligned with respect to the second linear group of vias such that a diagonal relationship between the groups of vias. The symmetrical linear diagonal relationship creates a set corridor spacing 242 between each diagonal via to allow routing of power lines and signal lines in the various layers of the printed circuit board 200 in this area established by the set corridor spacing.

Aligning a group of vias in a linear routing scheme with fixed corridor spacing allows a more symmetric routing of lines in all of the layers of the printed circuit board 200. Also, making the input/output pad approximately the same width dimension as a trace line connected to that input/output pad allows a more symmetric routing of lines on the various layers of the printed circuit board 200. Both making the input/output pad approximately the same width as the trace lines and the fixed corridor spacing allow may be part of a routing scheme that generates an increased amount of routable input/output pads per layer than used in some previous routing schemes. Additionally, offsetting the alignment of the input/output pads 202, 204 at the edge of the printed circuit board 200 in an asymmetric comb like shape may generate an increased amount of routable input/output pads per layer. For example, the third input/output pad 244 is offset with respect to the first input/output pad 220 and the fourth input/output pad 246.

An increased amount of routable input/output pads per layer may reduce the number of layers in a printed circuit board 200 needed to provide power and facilitate all of the signals into and out of a silicon die in the package. In an embodiment, a twenty-three mm by twenty-three mm printed circuit board 200 may have greater than six hundred input/output pads per layer of printed circuit board 200 due to the set corridor spacing and making the input/output pads the same width dimension as a trace line connected to that input/output pad. The signal input/output trace lines may be routed, for example, on layers one and four of the printed circuit board 200 and the power and ground trace lines may be routed, for example, on layers two and three of the printed circuit board 200. Further, more than two hundred and fifty power and ground contacts may be routed on layers two and three of the printed circuit board 200. Thus, making the input/output pads the same width as the trace line connecting to that input/output pad provides a signal connection from a printed circuit board 200 to a component to increase density and routability of trace lines on that printed circuit board 200.

Making the input/output pads the same width as the trace line can sometime be called line to line routing. The line to line routing scheme may be especially useful in and around large Application Specific Integrated Circuits (ASICs). The line to line routing scheme and electro mechanical mating may occur at the second level interconnect level (i.e. between the package and the printed circuit board rather then the silicon to the package/first interconnect level or the printed circuit board to a subassembly/component/third interconnect level).

The printed circuit board 200 may have, on top layer in the corner, wider traces 248 and accordingly wider input/output pads, such as a fifth input/output pad 250, in a densely packed area to aid in securing the mechanical solder bond between the printed circuit board 200 and the package. A high density of solder connections may exist around the edge of the printed circuit board 200 by making the input/output pads the same width as the trace line connecting to that input/output pad and offsetting the alignment of the input/output pads at the edge of the printed circuit board in an asymmetric comb like shape. The higher density of solder connections increases solder joint reliably and should not adversely effect solder joint compliancy.

The thinner trace lines, such as the first trace line 222 may be four mils wide, and the input/output pads, such as the first input/output pad 220 may be four mils wide. The pitch spacing between trace lines in the set corridor spacing may be two tenths of a millimeter or smaller. A trace line going to a pad having a spherical solder ball may need to maintain a greater pitch spacing to avoid causing an electrical short with a neighboring trace during the reflow process due to excess solder from the solder ball on the package and the solder paste on the printed circuit board 200. Electrical shorts created during the reflow process of input/output pads having the same width dimension as a trace line connected to that input/output pad may be reduced even with the decreased pitch spacing between the trace lines. Each via may be, for example, twelve mils in diameter with a finished hole size of six mils in diameter. Around each via an anti-pad area may exist such as twenty four mils extending from the edges of the via in which all conductive material except the trace connecting to the via is kept out of the anti-pad area.

Figure 2C:
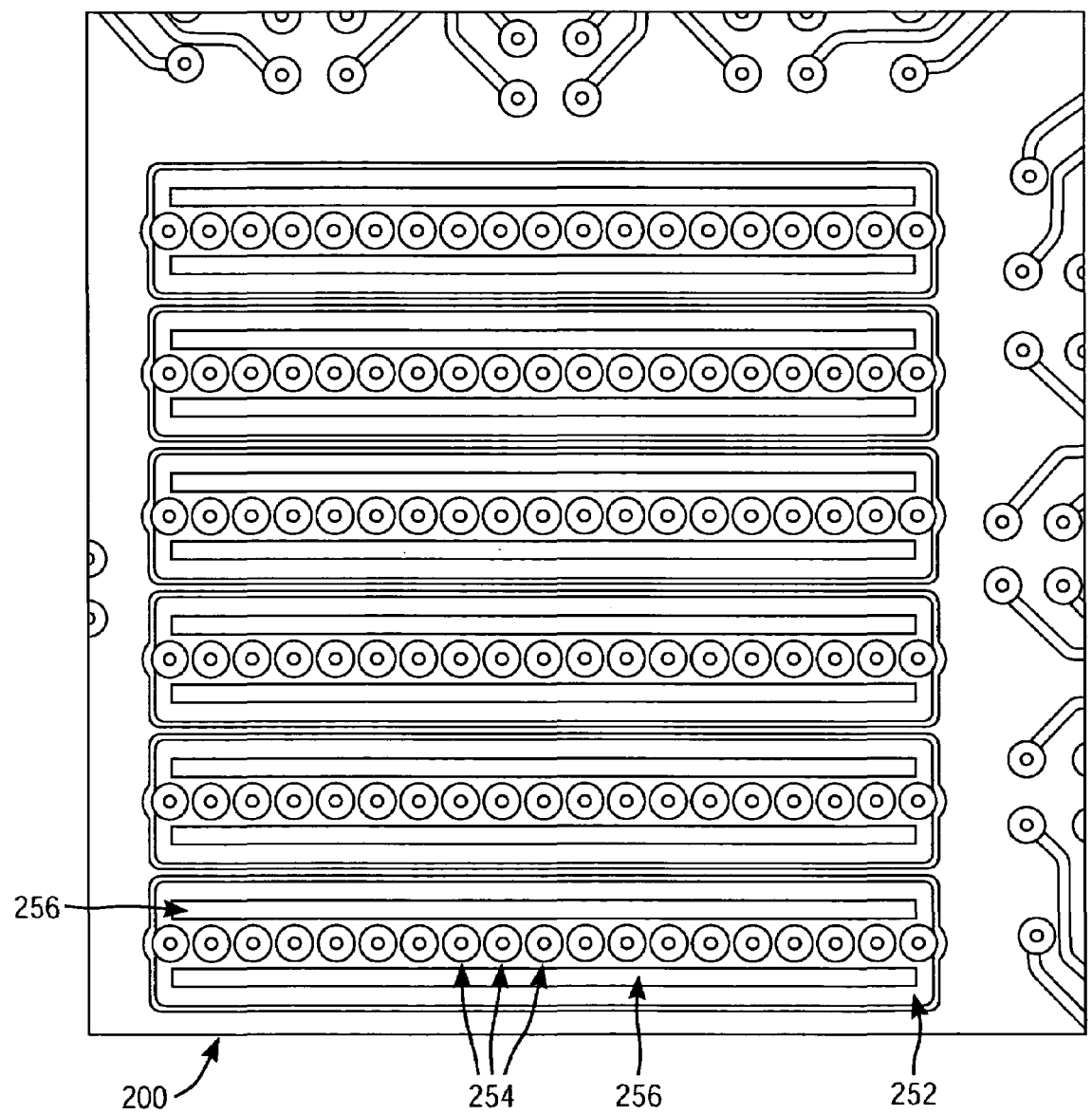

FIG. 2c illustrates a magnified view of the center of the example printed circuit board illustrated in FIG. 2a. Referring to FIG. 2c, the center portion of the printed circuit board 200 may contain the power supply bus bars, such as a first power supply bus bar 252. The power supply bus bars typically form a highly concentrated and densely packed area of vias 254 and input/output pads 256. Multiple bus bars may be located in the center of the printed circuit board 200 and adjacent to each other. This densely packed area of input/output pads may be used to anchor the mechanical solder bond between the printed circuit board 200 and the package. The anchored mechanical solder bond may be at a location where a highest coefficient of thermal expansion mismatch, i.e. greatest difference, exists between the printed circuit board 200 and the package. The anchoring of the mechanical bond between the printed circuit board 200 and the package is generated by locating the highest density of solder connections between the printed circuit board 200 and the package at the location of the highest coefficient of thermal expansion mismatch between the printed circuit board 200 and the package. The anchoring at the location where a highest coefficient of thermal expansion mismatch exists may be accomplished by placing the power bus connections on the printed circuit board 200 under the silicon area in the package. The greatest strains and stresses to separate the mechanical bond between the printed circuit board 200 and the package may exist at the location of the highest coefficient of thermal expansion mismatch between the package and the printed circuit board 200. The solder joint reliability throughout the entire board may be stabilized by creating a highest density of solder connections between the printed circuit board 200 and the package at the location of the highest coefficient of thermal expansion mismatch between the printed circuit board 200 and the package. The mechanical solder bond between the printed circuit board 200 and the package may be anchored by locating the power bus bar connections in the center of the printed circuit board 200.

Figure 3:
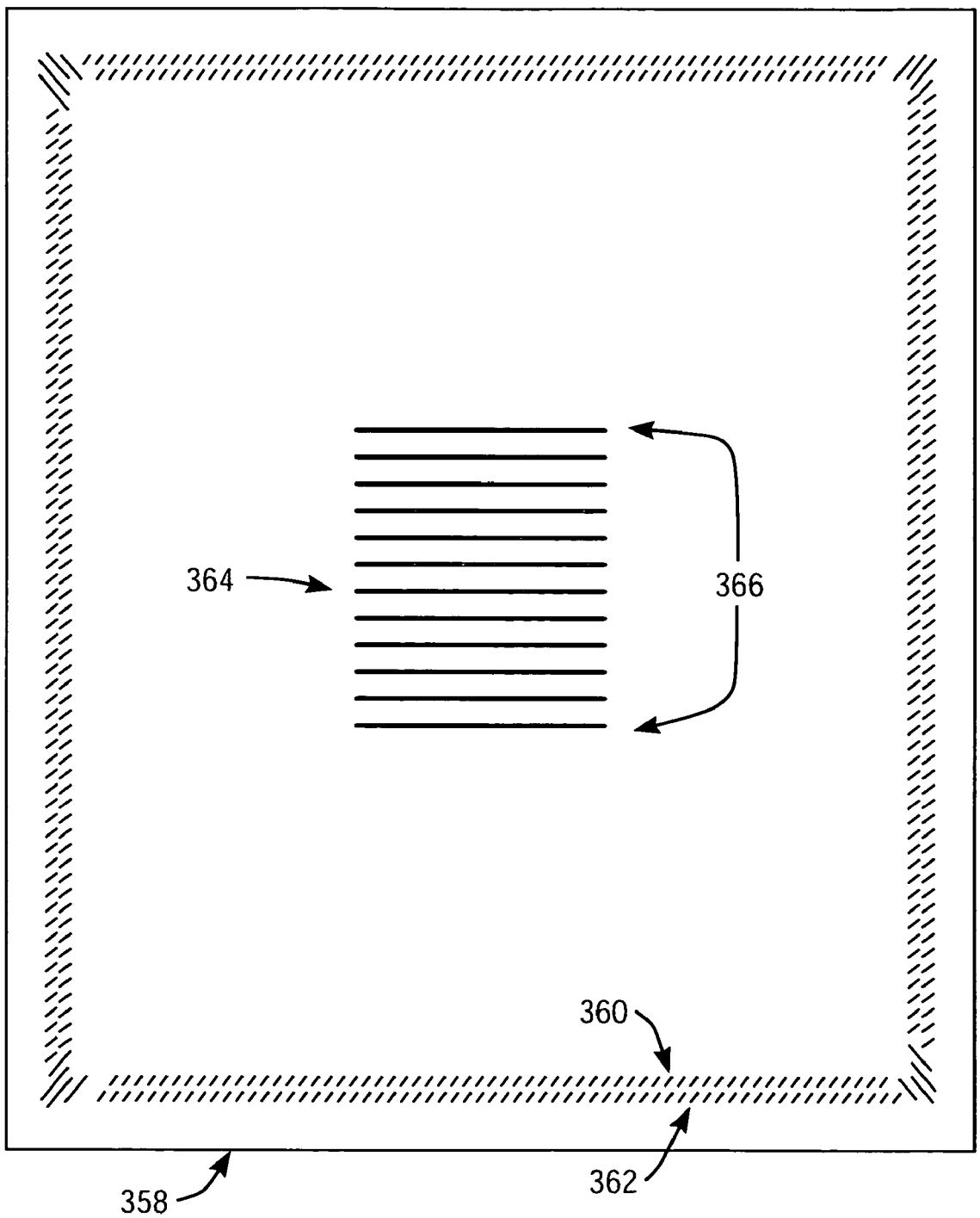
FIG. 3 illustrates a package having solder connections to solder the package to the printed circuit board.

FIG. 3 illustrates a package having solder connections to solder the package to the printed circuit board. Referring to FIG. 3, the pad lay-out of the package 358 consists of square pads 360 362 that are two offset rows deep. The footprint of the solder connections on the top layer of the printed circuit board mirrors the footprint of the solder connections of the package 358. The package 358 also incorporates a high density soldering scheme under the die shadow area 364 in the center of the package 358. The horizontal solder connection bars 366 in the center of the package 358 mate-up to the power bus bars in the printed circuit board. The solder connections around the edge of the package 360, 362 mate up to the input/output pads around the edge of the printed circuit board. The package 358 may correspond to the shape of the printed circuit board and be slightly larger in dimensions such as twenty eight millimeters per side. The package design may mirror the printed circuit board pad lay-out. Package and printed circuit board pads may be an approximate one to one in size ratio.

The line to line routing scheme may provide a higher input/output count while holding or decreasing substrate size as well as other benefits such as a reduction in packaging costs, negligible change in manufacturing costs, enables ability to support higher functionality in a physically smaller package 358, and improves routability on the printed circuit board. The package 358 and the printed circuit board may utilize square pads with solder paste stenciled on at the secondary interconnect location instead of solder balls to connect to the printed circuit board to the package 358 during board assembly. The milli-bump soldering process used during the assembly process may utilize uniform rectangular volume of solder deposit on package 358 and printed circuit board. The soldering process creates solder connections between the input/output pads and the package 358 by a solder screening process that utilizes a solder stencil to control the location of solder deposit, aperture size in the stencil, and paste height of the solder applied to that location. Further, the solder may be applied to the pads, via the milli-bump soldering process, prior to being shipped for printed circuit board assembly.

Also, reducing the physical dimensions of the package 358 and the printed circuit board also tends to reduce the co-planarity issues between the package 358 and the printed circuit board.

Figure 4:
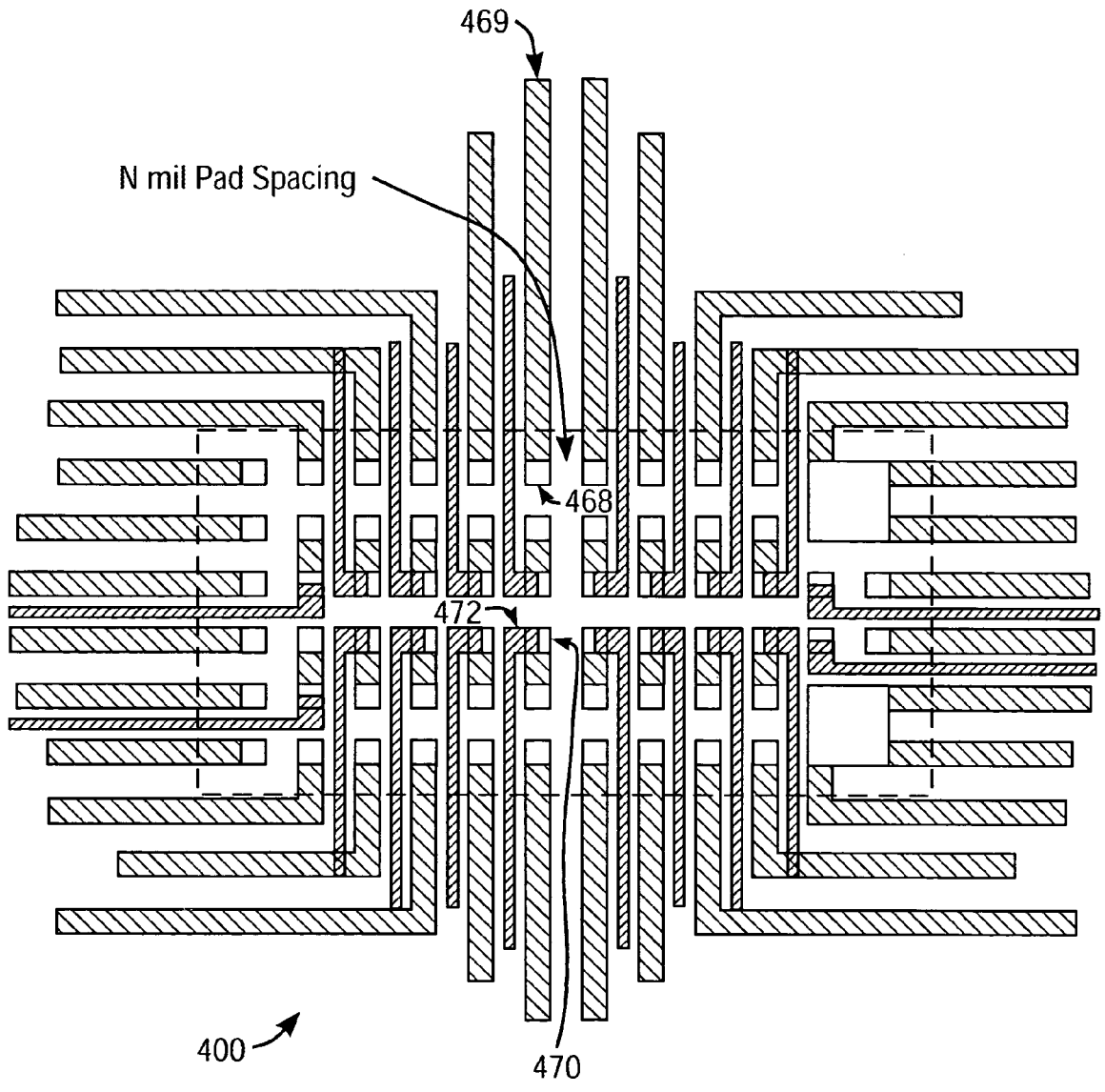
FIG. 4 illustrates a top view of layout diagram of an embodiment of making the input/output pad on a printed circuit board approximately the same width dimension as a trace line connected to that input/output pad.

FIG. 4 illustrates a top view of layout diagram of an embodiment of making the input/output pad on a printed circuit board approximately the same width dimension as a trace line connected to that input/output pad. Referring to FIG. 4, the printed circuit board 400 has two layers. A first layer and a second layer. On both layers the input/output pads on the printed circuit board 400 are approximately the same width dimension as the trace lines connecting to those input/output pads. For example, the first input/output pad 468 on the first layer has approximately the same width dimension as the first trace line 469 connecting to the first input/output pad 468. The second input/output pad 470 on the second layer has approximately the same width dimension as the second trace line 472 connecting to the second input/output pad 470. Note, a portion of the second trace line has been reduced in size and alter in hash markings to illustrate the two different layers of the printed circuit board 400. The routing scheme to support this package may use, for example, 0.004" traces and 0.004" spaces, with, for example, 0.003" microvias connecting the two signal layers. The printed circuit board 400 made be composed of a fiberglass material such as FR-4. The printed circuit board 400 may be less than thirty mils per edge and the package may be less than thirty-five mils per edge.

The line to line routing increases the density of solder joints to maintain or improve solder joint compliancy over large spherical joints because of the reduced size of the joint. The line to line routing routes trace line may be approximately equal in width to the pads for components, signal lines, and power lines to achieve a high input/output count devices. The line to line routing increases the input/output count and is better at routing those signals to increase package functionality. The milli-bump soldering process may allow for smaller, controlled amounts of solder, reducing the issue of solder joint opens and shorts.

Figure 5A:
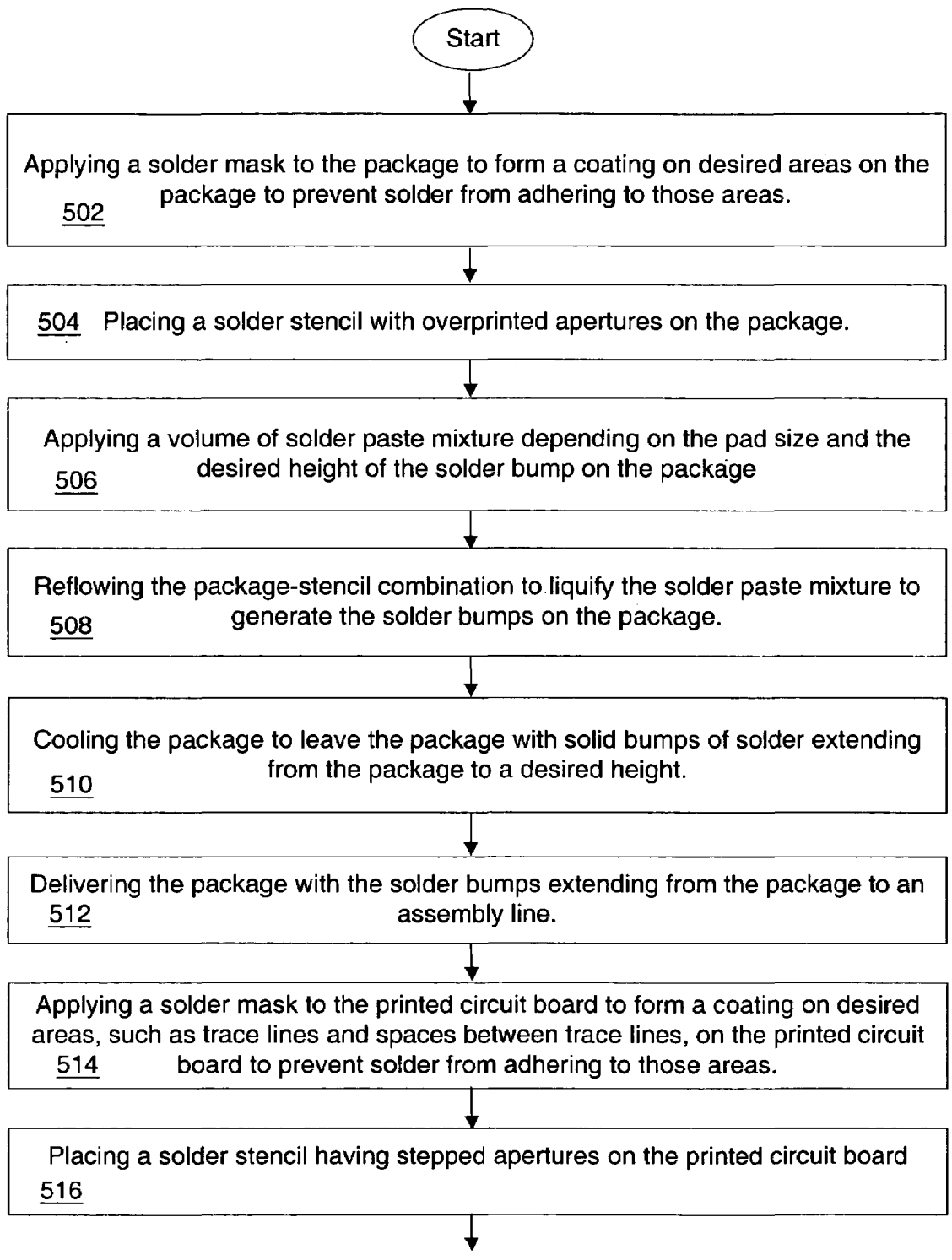

FIGS. 5a and 5b illustrate a flow diagram of an embodiment to generate a solder connection between a pad of a package and an input/output pad on a printed circuit board having approximately the same width dimension as a trace line connected to that input/output pad. The package contact pads may receive solder through a solder screening process that utilizes a solder stencil, which controls the location of solder deposit on the package, aperture size in the stencil, and paste height used to the formed solder bumps. The solder screening process may eliminate circular pads to match spherical solder balls and instead utilize rectangular pads to match trapezoidal solder connections.

In block 502, a solder mask may be applied to the package to form a coating on desired areas, such as trace lines and spaces between trace lines, on the package to prevent solder from adhering to those areas. The intent is to limit the solder to adhere to the merely the pads.

In block 504, a solder stencil with overprinted apertures may be placed on the package. The frame of the polished stainless steel solder stencil has numerous cut out holes called apertures. Each aperture in the stencil corresponds to an area on the package intended to receive solder, such as an input/output pad. The aperture dimensions of the hole formed in the frame of the stencil material are slightly overprinted for the solder connections between the package and the input/output pads on the printed circuit board. Overprinted meaning if the width of the square pad is 1×mm, then the aperture may be between 1.1 times greater to 1.3 times greater than the 1× dimension. For example, if the square input/output pad width is 4 mils, then the aperture corresponding to that input/output pad in the stencil may be 5 mils.

In block 506, a volume of solder paste mixture may be applied to the package depending on the pad size and the desired height of the solder bump on the package formed by the stencil and sequent reflow operation on the package. The thickness of the stencil may be determined by a ratio of pad size to desired solder paste height. The desired height of the solder bump may be an approximately a 1:1 ratio of height of the solder bump to width of the pad. The volume of solder paste mixture put into the overprinted aperture may be 1.1× to 1.3× the desired height. A squeegee applies the solder paste mixture and forces that volume of solder into the aperture of the solder stencil. The solder stencil may have hundreds or thousands of apertures formed in that stencil and the squeegee forces the solder paste mix into every aperture to fill that aperture. The polished stainless steel stencil may be then removed from the package.

In block 508, the package-stencil combination may be reflowed by heating the package in an oven to liquefy the solder paste mixture to generate the solder bumps on the package. The slightly greater volume of solder paste mixture decreases to the desired volume during reflow process through wicking action. The actual solder is drawn back into the pad and expels air and flux to become a solid mass of solder.

In block 510, the package may be cooled to leave the package with solid bumps of solder extending from the package to a desired height.

In block 512, the package with the solder bumps extending from the package may be delivered to an assembly line.

In block 514, a solder mask may be applied to the printed circuit board to form a coating on desired areas, such as trace lines and spaces between trace lines, on the printed circuit board to prevent solder from adhering to those areas.

In block 516, a solder stencil having stepped apertures may be placed on the printed circuit board. Stepping the apertures of the stencil to control the height of the solder extending up from the printed circuit board. The stencil may be stepped by brazing an insert into the aperture corresponding to the input/output pad on the printed circuit board. The insert may be a trapezoidal insert that may be lower in height than the planar surface of the stencil to form a depression at that area in the stencil or the trapezoidal insert may be higher in height than the planar surface of the stencil to form a bump at that area in the stencil. The height or thickness of the stencil may be typically equal to the designed total distance between the planar surface of the printed circuit board and the planar surface of the package. The solder stencil controls the location of solder deposit on the package. The aperture size in the stencil controls solder volume. The thickness of the stencil and whether the aperture has a stepped insert or not controls paste height used to the formed solder bumps. Thus, the printed circuit board may be bumped by using a stencil and paste method that steps the thickness in the stencil to provide multiple paste heights with the same stencil.

In block 518, a solder paste mixture may be applied with a squeegee to fill in the solder paste mixture into all of the apertures of the stencil In block 520, the amount of solder to form the solder connection between the printed circuit board and the package may be controlled by using the stenciling process.

In block 522, various electrical components, such as resisters, chips, etc., may be inserted onto the printed circuit board.

In block 524, the package may be aligned to the printed circuit board. For dense packages, an alignment by optical placement may be performed. Alignment of the printed circuit board to the package during the manufacturing process may be performed by using a video camera to view the image of the solder connections on the package and superimpose that picture over an image in a mirror of the printed circuit board until they match up. When the image from the camera and the image from the mirror are in match up, then the package and the printed circuit board are secured together. The package and the printed circuit board then may undergo a reflow operation. This alignment procedure differs from a previous outline placement alignment procedure of shining a light to align the four corners of the package with the four corners of the printed circuit board and when no light is visible the corners are aligned. Accordingly, the projected solid solder bumps on the package will meet up with the solder pasted input/output pads. Solder from the solder bump on the package is stacked upon the solder paste mixture on the printed circuit board to achieve a controlled uniform height.

In block 526, the package to printed circuit board combination is reflowed in an oven to liquefy the solder to create the solder connections between the printed circuit board and package. Once solder paste is applied, the packages are processed through a reflow oven at a profile with a target temperature recommended by the solder paste manufacturer. The solder connections may be cylindrical in height with slightly sunken in sides and match the shape of the input/output pad. Thus, for a square input/output pad the solder connection ends up having a square shape with concave sides rather than a spherical solder ball with convex sides. Enough volume of solder exists when the solder is liquefied to create the connection but not enough volume to form a convex surface and potentially spill out or spread away from that input/output pad. When the solder connection cools the sides slightly sink in.

FIG. 6a illustrates a cross-sectional view of a Chip Scale Package using a solder ball to establish a solder bond between the printed circuit board and package. Referring to FIG. 6a, the Chip Scale Package 647 uses a spherical solder ball 649 with convex sides. During the assembly line process, the spherical solder ball 649 is melted to form the solder connection between the package 647 and the printed circuit board 651.

FIG. 6b illustrates a cross-sectional view of a package using a solder bump to establish a solder bond between the printed circuit board and package. Referring to FIG. 6b, the package 658 may have a pad 660 with a tinned surface 662. The printed circuit board 600 may have an input/output pad 664 with a tinned surface 666. The package 658 may have a solid solder bump after a reflow process on the package 658 but before the package 658 is delivered to an assembly line. A plurality of solder bumps may extend from the package to a desired height, such as a first solder bump 668. The solder bump height may be determined by the final pad size to desired solder height ratio. The height of the solder bump may be approximately equal to the width of the pad. Each solder bump corresponds to a particular input/output pad on the printed circuit board. Each solder bump may have a uniform height with respect to the other solder bumps created. Each solder bump may mate with solder paste on the input/output pad of a printed circuit board in a subsequent reflow operation to create solder connections between the printed circuit board and the package.

The two tiered milli bump soldering process can also be reversed so that the printed circuit board has a solder bump extending from the printed circuit board prior to shipping the printed circuit board to the assembly line rather than the package having solder bumps.

Figure 7:
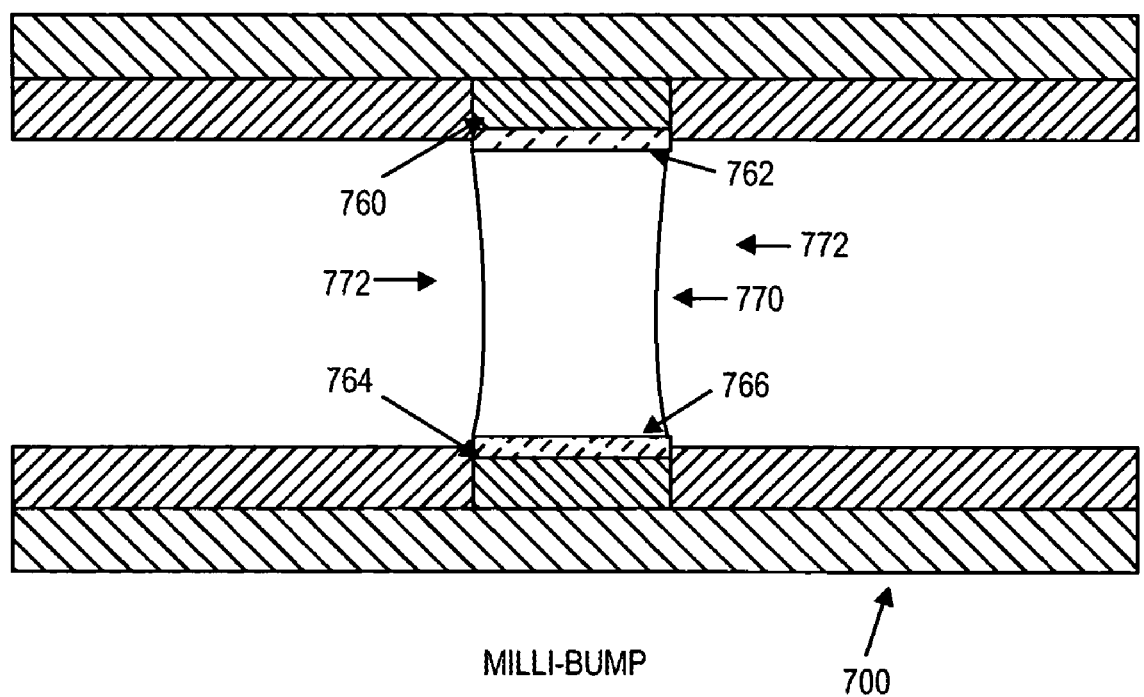
FIG. 7 illustrates a cross-sectional view of a solder connection between the package and an input/output pad on a printed circuit board.

FIG. 7 illustrates a cross-sectional view of a solder connection between the package and an input/output pad on a printed circuit board. Referring to FIG. 7, the package 758 may have a pad 760 with a tinned surface 762. The printed circuit board 700 may have an input/output pad 764 with a tinned surface 766. A solder connection 770 may be created between the package 758 and the printed circuit board 700. The solder connection 770 may have concave sides 772 and match the shape of the input/output pad 764. Square pads 760, 764 may be used to maximize amount of solder held by the pads and making the dimension matching with connecting trace lines easier. The solder connection 770 may be shaped by controlling the volume of solder to form the solder connection 770 between the printed circuit board 700 and the package 758. The volume of solder used to create the solder connection 700 may be controlled by using a stenciling process on the package 758 as well as on a printed circuit board 700.

Thus, the outcome of the milli-bump soldering process on a package is a plurality of uniform solder bumps, that each has a roughly level contact area, and can be integrated with standard manufacturing equipment and manufacturing flows. By controlling the solder volume and standoff heights, the milli-bump soldering process allows for sufficient solder to give the solder joint the necessary amount of compliance to meet solder reliability standards yet does not lend the assembly process to cause bridging through solder shorts.

The smaller and controlled amount of solder produced by the milli bump process may create smaller pad sizes. The amount of solder also controls the solder volume and the standoff heights without creating excessive amounts of solder and subsequent bridging. As the spherical solder ball increases in the Z dimension, the ball also increases in its X dimension.

The smaller controlled amount of solder also allows for sufficient solder to give the joint the necessary amount of compliance. The smaller pad sizes lead to smaller printed circuit board and package dimensions. The decreased size of the package and printed circuit board decreases co-planarity issues between that package and the printed circuit board.

In one embodiment, the software used to facilitate the routing scheme may be embodied onto a machine-readable medium. The software instructions, such as Gerber files, may denotes all geometric locations, size and configuration of the printed circuit board and package as well as the metallurgy of the contacts and the routing schemes embedded in the printed circuit board. The software instructions may be used to generate routing diagrams and schematics, pad size and location, as well as device placement including keep out zones and any support information. The software instructions may also provide guidance to placement of manufacturing integration, alignment equipment, paste application methodology & metallurgy, reflow profiles, and test methodologies & test equipment.

A machine-readable medium includes any mechanism that provides (i.e., stores and/or transmits) information in a form accessible by a machine (e.g., a computer, network device, personal digital assistant, manufacturing tool, any device with a set of one or more processors, etc.). For example, a machine-readable medium includes recordable/non-recordable media (e.g., read only memory (ROM); random access memory (RAM); magnetic disk storage media; optical storage media; flash memory devices; etc.), as well as electrical, optical, acoustical or other form of propagated signals (e.g., carrier waves, infrared signals, digital signals, etc.); etc.

While some specific embodiments of the invention have been shown the invention is not to be limited to these embodiments. The invention is to be understood as not limited by the specific embodiments described herein, but only by scope of the appended claims.

We claim:

1. A machine readable medium storing instructions on a routing scheme for a printed circuit board, that, if executed by the machine, will cause the machine to perform operations, comprising:
   making an input/output pad on the printed circuit board approximately the same width dimension as a trace line on the printed circuit board, the trace line being connected to the input/output pad in the printed circuit board; and
   aligning a first group of three or more vias in the printed circuit board into a planar line with a set corridor spacing between adjacent of groups of three or more vias also aligned into a planar line with the same axis to allow a routing space for lines in multiple layers of the printed circuit board to occur in the routing space established by the set corridor spacing.

2. The article of manufacture of claim 1, storing additional instructions on the routing scheme for the printed circuit board, that, if executed by the machine, will cause the machine to perform operations, comprising:
   forming line to line connections between a package and the printed circuit board.

3. The article of manufacture of claim 1, wherein the first group of vias includes a four or more vias aligned in a row and adjacent rows of vias are aligned in a parallel line to the first group to establish the set corridor spacing between the adjacent rows of vias.

4. The article of manufacture of claim 1, wherein the first group of vias includes a four or more vias aligned in a diagonal line and adjacent diagonal lines of vias are aligned in a parallel line to the first group to establish the set corridor spacing between the adjacent rows of vias.

5. The article of manufacture of claim 1, storing additional instructions on the routing scheme for the printed circuit board, that, if executed by the machine, will cause the machine to perform operations, comprising:
   locating a power bus bar connection in a center of the printed circuit board.

6. The article of manufacture of claim 1, storing additional instructions on the routing scheme for the printed circuit board, that, if executed by the machine, will cause the machine to perform operations, comprising:
   offsetting an alignment of input/output pads at an edge of the printed circuit board in an asymmetric shape.

7. An apparatus generated by the instructions stored in the article of manufacture of claim 1.

8. The apparatus of claim 7, wherein a solder connection between the input/output pad and a package is created by a solder screening process that utilizes a solder stencil to control a location of solder deposit and a volume of solder applied to that location.

9. A method, comprising:
   laying out an input/output pad on a printed circuit board that is approximately the same width dimension as a trace line on the printed circuit board, the trace line connecting to the input/output pad in the printed circuit board; and
   aligning a first group of three or more vias in the printed circuit board into a planar line with a set corridor spacing between adjacent of groups of three or more vias also aligned into a planar line with the same axis to allow a routing space for lines in multiple layers of the printed circuit board to occur in the routing space established by the set corridor spacing.

10. The method of claim 9, further comprising:
    locating a power bus bar connection in a center of the printed circuit board.

11. The method of claim 9, further comprising:
    forming a solder bond between the printed circuit board and a package at the input/output pad.

12. The method of claim 9, further comprising:
    offsetting an alignment of input/output pads at the edge of the printed circuit board in an asymmetric shape.

13. The method of claim 9, further comprising:
    using a solder screening process that utilizes a solder stencil to control the location of solder deposit and paste height to generate a solder connection between the input/output pad and a package.

14. An apparatus, comprising:
    means for making an input/output pad on a printed circuit board that is approximately the same width dimension as a trace line on the printed circuit board, the trace line connecting to the input/output pad in the printed circuit board; and
    means for aligning a first group of three or more vias in the printed circuit board into a planar line with a set corridor spacing between adjacent of groups of three or more vias aligned into a planar line with the same axis to allow a routing space for lines in multiple layers of the printed circuit board to occur in the routing space established by the set corridor spacing.

15. The apparatus of claim 14, further comprising:
    means for creating a power bus bar connection in a center of the printed circuit board.

16. The apparatus of claim 14, further comprising:
    means for forming a solder bond between the printed circuit board and a package at the input/output pad.

17. The apparatus of claim 14, further comprising:
    means for using a solder screening process that utilizes a solder stencil to control the location of solder deposit and paste height to generate a solder connection having concave sides between the input/output pad and a package.

* * * * *